US012761808B2

(12) United States Patent
Ciocchini et al.

(10) Patent No.: US 12,761,808 B2
(45) Date of Patent: Oct. 13, 2026

(54) DYNAMIC ADJUSTMENT OF THRESHOLD VOLTAGE OFFSETS FOR WORDLINE GROUPS

(71) Applicant: MICRON TECHNOLOGY, INC., Boise, ID (US)

(72) Inventors: Nicola Ciocchini, Boise, ID (US); Thomas Lentz, Boise, ID (US); Ugo Russo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/733,350

(22) Filed: Jun. 4, 2024

(65) Prior Publication Data

US 2024/0427500 A1 Dec. 26, 2024

Related U.S. Application Data

(60) Provisional application No. 63/522,060, filed on Jun. 20, 2023.

(51) Int. Cl.

| | |
|---|---|
| ***G06F 12/00*** | (2006.01) |
| ***G06F 3/06*** | (2006.01) |
| ***G11C 16/08*** | (2006.01) |
| ***G11C 16/26*** | (2006.01) |
| *G11C 16/04* | (2006.01) |

(52) U.S. Cl.

CPC .......... *G06F 3/0619* (2013.01); *G06F 3/0653* (2013.01); *G06F 3/0659* (2013.01); *G06F 3/0679* (2013.01); *G11C 16/08* (2013.01); *G11C 16/26* (2013.01); *G11C 16/0483* (2013.01)

(58) Field of Classification Search

CPC ..... G06F 3/0613; G06F 3/0659; G06F 3/0679

USPC .......................................................... 711/103

See application file for complete search history.

(56) References Cited

U.S. PATENT DOCUMENTS

| | | | | |
|---|---|---|---|---|
| 9,244,763 | B1 * | 1/2016 | Kankani | G06F 11/1068 |
| 11,726,689 | B2 * | 8/2023 | Nowell | G06F 3/064 711/154 |
| 11,783,901 | B2 * | 10/2023 | Muchherla | G06F 11/0727 711/154 |
| 2019/0004734 | A1 * | 1/2019 | Kirshenbaum | G06F 3/0659 |
| 2022/0164106 | A1 * | 5/2022 | Nowell | G06F 3/064 |
| 2022/0189564 | A1 * | 6/2022 | Rayaprolu | G11C 16/3459 |
| 2023/0176788 | A1 * | 6/2023 | Lee | G06F 3/0679 711/154 |

(Continued)

*Primary Examiner* — Mohamed M Gebril

(74) *Attorney, Agent, or Firm* — Lowenstein Sandler LLP

(57) ABSTRACT

A system includes a memory device and a processing device, operatively coupled with the memory device, to perform operations including: receiving a request to perform a read operation on a set of memory cells of the memory device; identifying a wordline group coupled to the set of memory cells of the memory device; identifying a threshold voltage offset bin associated with the set of memory cells; determining a current temperature associated with the set of memory cells; determining, based on the threshold voltage offset bin and the current temperature, a read mask identifier associated with the set of memory cells; determining, based on the read mask identifier and the wordline group, a set of threshold voltage offsets associated with the set of memory cells; and performing the read operation using the set of threshold voltage offsets.

17 Claims, 8 Drawing Sheets

(56) References Cited

U.S. PATENT DOCUMENTS

| | | | | |
|---|---|---|---|---|
| 2024/0071553 | A1* | 2/2024 | Chang | G11C 16/08 |
| 2024/0427500 | A1* | 12/2024 | Ciocchini | G06F 3/0679 |

* cited by examiner

| Set-N 301 | | | | | | | | | |
|---|---|---|---|---|---|---|---|---|---|
| | | Bins 303 | | | | | | | |
| | | 0 | 1 | 2 | 3 | 4 | 5 | 6 | 7 |
| Valleys 305 | 1 | *a* | *c* | *c* | *d* | *d* | *e* | *f* | *g* |
| | 2 | *b* | *d* | *e* | *f* | *g* | *h* | *i* | *j* |
| | 3 | *d* | *e* | *f* | *g* | *h* | *i* | *j* | *k* |
| | 4 | *l* | *m* | *n* | *o* | *p* | *q* | *r* | *s* |
| | 5 | *m* | *n* | *o* | *s* | *s* | *t* | *t* | *u* |
| | 6 | *u* | *u* | *v* | *w* | *w* | *x* | *y* | *y* |
| | 7 | *v* | *v* | *w* | *w* | *x* | *y* | *z* | *z* |

FIG. 3

500A

| Bin | Temperature | Read Mask ID | Read Mask ID Sequence |
|---|---|---|---|
| B#<=B1 | T < T11 | X1 | X1, X4, X2, X3,Y1 |
| B#<=B1 | T11 <= T < T12 | X2 | X2, X3, X4, X1, Y2 |
| B#<=B1 | T12 <= T < T13 | X3 | X3... |
| B#<=B1 | T13 <= T | X4 | X4... |
| B#>=B2 | T <= T21 | Y1 | Y1... |
| B#>=B2 | T > T22 | Y2 | Y2... |
| ... | ... | ... | ... |

500B

| Read Mask ID | WGR0 | ... | WGRx | ... | WGRn |
|---|---|---|---|---|---|
| X1 | O1 | ... | ... | ... | O7 |
| X2 | O2 | ... | ... | ... | O8 |
| X3 | O3 | ... | ... | ... | O9 |
| X4 | O4 | ... | ... | ... | O4 |
| Y1 | O5 | ... | ... | ... | O5 |
| Y2 | O6 | ... | ... | ... | O2 |
| ... | ... | ... | ... | ... | ... |

FIG. 5

600

| Bin | Temperature | PEC | Read Mask ID | WRG0 | ... | WRGx | ... | WRGn |
|---|---|---|---|---|---|---|---|---|
| B1 | T11 | P1 | X1 | O1 | ... | ... | ... | O7 |
| B1 | T12 | P2 | X2 | O2 | ... | ... | ... | O8 |
| B1 | T13 | P3 | X3 | O3 | ... | ... | ... | O9 |
| B1 | T14 | P4 | X4 | O4 | ... | ... | ... | O4 |
| B2 | T21 | P1 | Y1 | O5 | ... | ... | ... | O5 |
| B2 | T22 | P2 | Y2 | O6 | ... | ... | ... | O2 |
| B2 | T23 | P3 | Y3 | O7 | ... | ... | ... | O2 |
| B2 | T24 | P4 | Y4 | O8 | ... | ... | ... | O1 |
| ... | ... | ... | ... | ... | ... | ... | ... | ... |

FIG. 6

DYNAMIC ADJUSTMENT OF THRESHOLD VOLTAGE OFFSETS FOR WORDLINE GROUPS

RELATED APPLICATIONS

This application claims the benefit of U.S. Provisional Patent Application No. 63/522,060, filed Jun. 20, 2023, the entire contents of which are incorporated by reference herein.

TECHNICAL FIELD

Embodiments of the disclosure relate generally to memory sub-systems, and more specifically, relate to dynamic adjustment of threshold voltage offsets for word-line groups.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 3 is an example of a set of threshold voltage offset bins as determined in accordance with some embodiments of the present disclosure.

FIGS. 5-6 are examples of data structures used to update read level voltage offsets for wordline groups, in accordance with some embodiments of the present disclosure.

DETAILED DESCRIPTION

Figure 1:
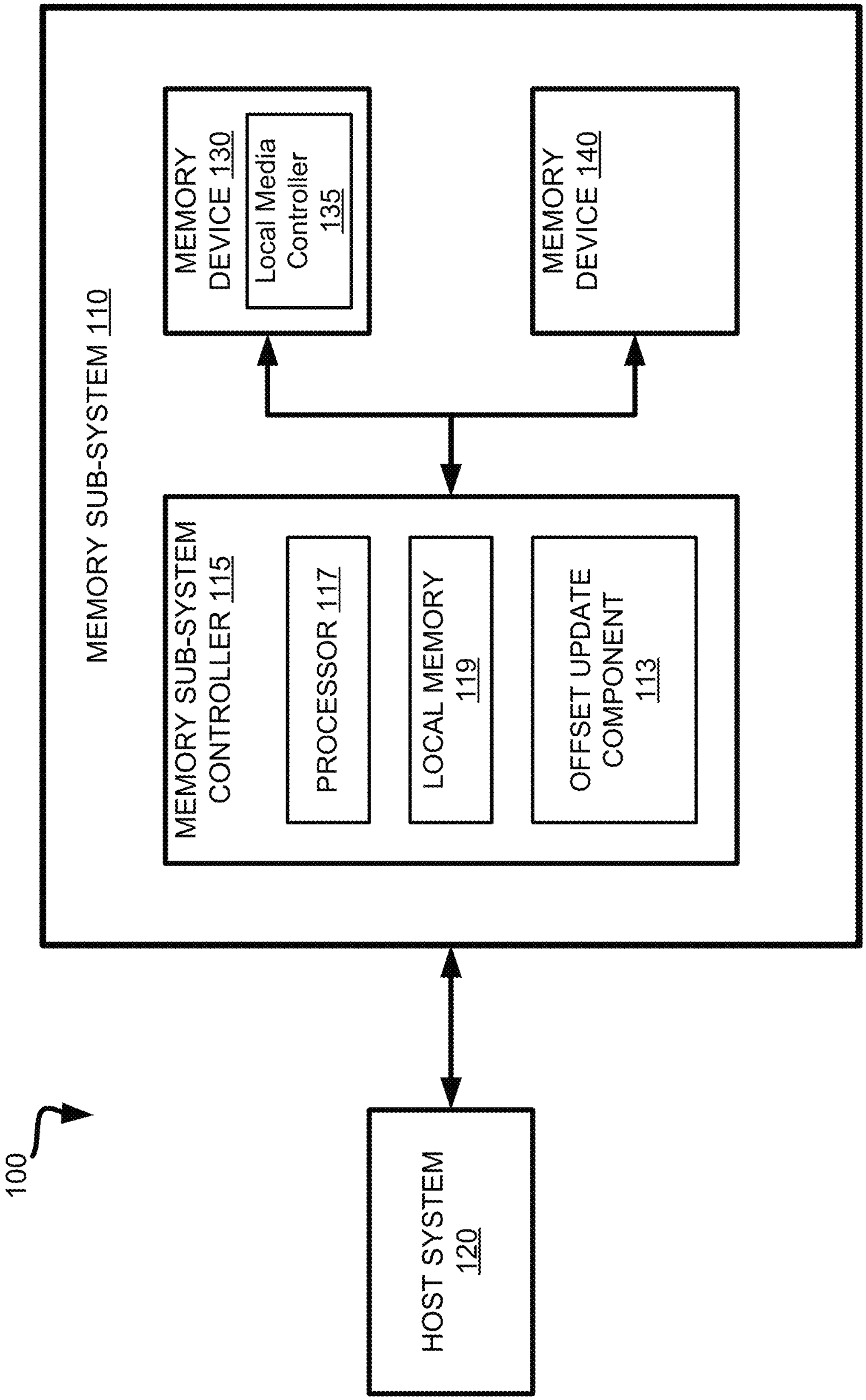
FIG. 1 illustrates an example computing system that includes a memory sub-system in accordance with some embodiments of the present disclosure.

Aspects of the present disclosure are directed to dynamic adjustment of threshold voltage offsets for wordline groups. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. One example of a non-volatile memory device is a not-and (NAND) memory device. Other examples of non-volatile memory devices are described below in conjunction with FIG. 1. A non-volatile memory device is a package of one or more dies. Each die includes one or more planes. For some types of non-volatile memory devices (e.g., NAND devices), each plane includes a set of physical blocks. Each block consists of a set of pages. Each page includes a set of memory cells. A memory cell ("cell") is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane.

A memory device includes multiple memory cells capable of storing, depending on the memory cell type, one or more bits of information. One type of cell is a single level cell (SLC), which stores 1 bit per cell and defines 2 logical states ("states") ("1" or "L0" and "0" or "L1") each corresponding to a respective $V_T$ level. Another type of cell is a multi-level cell (MLC), which stores 2 bits per cell and defines 4 states ("11" or "L0", "10" or "L1", "01" or "L2" and "00" or "L3") each corresponding to a respective $V_T$ level. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_T$ level. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. Thus, an n-level cell can use $2^n$ levels of charge to store n bits. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of cells.

Various data operations (e.g., write, read, erase, etc.) can be performed by the memory sub-system. The data operations can be host-initiated operations. For example, the host system can initiate a data operation (e.g., write, read, erase, etc.) on a memory sub-system. The host system can send access requests (e.g., write command, read command) to the memory sub-system, such as to store data on a memory device at the memory sub-system and to read data from the memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error-handling data (e.g., error correction code (ECC) codeword parity data), data version (e.g., used to distinguish age of data written), valid bitmap (which LBAs or logical transfer units contain valid data), etc.

A memory cell can be programmed (written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (having a charge Q stored thereon) there can be a threshold control gate voltage $V_T$ (also referred to as the "threshold voltage") such that the source-drain electric current is low for the control gate voltage ($V_{CG}$) being below the threshold voltage, $V_{CG}<V_T$. The current increases substantially once the control gate voltage has exceeded the threshold voltage, $V_{CG}>V_T$. Because the actual geometry of the electrodes and gates varies from cell to cell, the threshold voltages can be different even for cells implemented on the same die. The cells can, therefore, be characterized by a distribution P of the threshold voltages, $P(Q,V_T)=dW/dV_T$, where dW represents the probability that any given cell has its threshold voltage within the interval $[V_T,V_T+dV_T]$ when charge Q is placed on the cell. Valleys can be located between pairs of adjacent programming distributions. A valley can refer to an area or a region between a pair of adjacent programming distributions. The relative width of a valley can be approximated by valley margin. Valley margin can refer to a relative width or relative margin between pairs of adjacent programming distributions. Valley margin can refer to an absolute measurement in volts (e.g., millivolts (mV)) between two adjacent programming distributions.

A valley margin can also be referred to as a read window. For example, in a SLC cell, there is 1 read window that exists with respect to the 2 $V_T$ distributions. As another example, in an MLC cell, there are 3 read windows that exist with respect to the 4 $V_T$ distributions. As yet another example, in a TLC cell, there are 7 read windows that exist with respect to the 8 $V_T$ distributions. Read window size generally decreases as the number of states increases. For example, the 1 read window for the SLC cell may be larger than each of the 3 read windows for the MLC cell, and each of the 3 read windows for the MLC cell may be larger than each of the 7 read windows for the TLC cell, etc. Read window budget (RWB) refers to the cumulative value of the read windows.

A memory device can exhibit threshold voltage distributions $P(Q,V_T)$ that are narrow compared with the working range of control voltages tolerated by the cells of the device. Accordingly, multiple non-overlapping distributions $P(Q_k, V_T)$ ("valleys") can be fit into the working range allowing for storage and reliable detection of multiple values of the charge $Q_k$, k=1, 2, 3 . . . . The distributions (valleys) are interspersed with voltage intervals ("valley margins") where none (or very few) of the cells of the device have their threshold voltages. Such valley margins can, therefore, be used to separate various charge states $Q_k$—the logical state of the cell can be determined by detecting, during a read operation, between which two valley margins the respective threshold voltage $V_T$ of the cell resides. Specifically, the read operation can be performed by comparing the measured threshold voltage $V_T$ exhibited by the memory cell to one or more reference voltage levels corresponding to known valley margins (e.g., centers of the margins) of the memory device ("read level threshold").

Due to the phenomenon known as slow charge loss (SCL), the threshold voltage $V_T$ of a memory cell can change with time as the electric charge of the cell is diminishing, the process sometimes referred to as "temporal voltage shift" (TVS). TVS can include different components such as intrinsic charge loss, system charge loss, quick charge loss, etc. TVS generally increases with increasing number of by Program Erase Cycles (PEC), higher temperatures, and higher program voltages. TVS can show significant die-to-die variation and wordline group (WGR) to WGR variation. Since typical cells store negatively charged particles (electrons), the loss of electrons causes the threshold voltages to shift along the voltage axis towards lower threshold voltages $V_T$. The threshold voltages can change rapidly at first (immediately after the memory cell is programmed) while slowing down at larger times in an approximately log-linear or power-law fashion ($\Delta V_T(t)=-C*t_b$) with respect to the time t elapsed since the cell programming event.

In some memory sub-systems, TVS can be mitigated by keeping track of the time elapsed since the programming event as well as of the environmental conditions of a particular memory partition (block, plane, etc.) such as temperature and associating a voltage offset $\Delta V_T$ per valley to be used during read operations, where the standard "base read level" threshold voltage $V_T$ is modified by the voltage offset: $V_T \rightarrow V_T+\Delta V_T$ where $\Delta V_T$ is negative due to charge loss. "Base read level" refers to the initial threshold voltage level exhibited by the memory cell immediately after programming. Whereas TVS is a continuous process and the compensating for $\Delta V_T(t)$ can be a continuous function of time, adequate accuracy of offsets can be achieved in some embodiments with a discrete number of threshold voltage offset "bins." For example, the voltage offset associated with each threshold voltage offset bin, when applied to the base read level, minimizes error rates, i.e., there is no other threshold voltage offset set for a specific bin that results in lower error rates.

In some embodiments, a memory sub-system can employ block family based error avoidance strategies, where the TVS is selectively tracked for programmed blocks grouped by block families, and appropriate voltage offsets, which are based on block affiliation with a certain block family, are applied to the base read levels in order to perform read operations. "Block family" refers to a set of blocks that have been programmed within a specified time window and a specified temperature window. Since the time elapsed after programming and temperature are the main factors affecting the TVS, all blocks and/or partitions within a single block family are presumed to exhibit similar distributions of threshold voltages in memory cells, and thus would require the same voltage offsets to be applied to the base read levels for read operations. Block families can be created asynchronously with respect to block programming events. In an illustrative example, a new block family can be created whenever a specified period of time (e.g., a predetermined number of minutes) has elapsed since creation of the last block family or the reference temperature of memory cells has changed by more than a specified threshold value. The memory sub-system controller can maintain an identifier of the active block family, which is associated with one or more blocks as they are being programmed.

To implement the block family based error avoidance strategies, the memory sub-system controller can periodically perform a calibration process ("calibration scan") in order to evaluate a data state metric (e.g., a bit error rate) in order to associate each block family with one of the predefined threshold voltage offset bins, which is in turn associated with the voltage offset to be applied for read operations. The associations of blocks with block families and block families with threshold voltage offset bins can be stored in respective metadata tables maintained by the memory sub-system controller. The calibration scan can be periodically performed with respect to a block of the memory device to determine whether the read level offset for the block, and thus to update the bin association. For example, the memory sub-system controller can perform the calibration scan with respect to a set of pages addressable by a selected set of wordlines of the block (e.g., randomly selected set of wordlines), and thus update a threshold voltage offsets bin associated with the selected set of wordlines of the block. However, the updated threshold voltage offsets bin usually applies to not only the selected set of wordlines of the block but also the rest of wordlines in the block. In a case where there is a large WGR-WGR variation, applying such threshold voltage offsets bin to all wordlines in the block would cause large read position loss (RPL), resulting in read performance degradation.

Aspects of the present disclosure address the above-referenced and other deficiencies by implementing a memory sub-system that updates threshold voltage offsets associated with the wordline groups of the memory device. The memory sub-system controller can receive a read command to perform a read operation on the memory device. The read command specifies a logical address that can be used to identify a set of memory cells of the memory device (e.g., a block).

The memory sub-system controller can identify one or more wordline groups associated with the set of memory cells specified by the read command. In some implementations, the wordlines of the memory device can be grouped based on their respective physical locations. For example, a wordline group can be formed to include all wordlines within a certain distance between the first and last wordlines of the wordline group. The memory sub-system controller can use the logical address specified in the read command to identify the wordline(s), for example, via a page map, and then identify the wordline group corresponding the identified wordline(s). The page map is a data structure that maps the logical pages (e.g., logical address) to a physical block (e.g., wordline).

The memory sub-system controller can identify a threshold voltage offset bin assigned to a block family associated with the set of memory cells specified by the read command. In some implementations, the memory sub-system controller can identify, via a metadata table, a threshold voltage offset bin assigned to the block family associated with the read command. The metadata table associates blocks with their respective block families and further associates block families and dies with their respective threshold voltage offset bins. The memory sub-system controller can identify the block family associated with the memory partition identified by the logical address specified in the read command and identify the current threshold voltage offset bin associated with the identified family through the metadata table.

The memory sub-system controller can determine a characteristic temperature associated with the set of memory cells (e.g., a block) to be read as either the current temperature of the die on which the block resides or a cross-temperature of the set of memory cells (i.e., the difference between the current temperature of the die and the temperature of the die recorded at the time of performing the most recent programming operation with respect to the set of memory cells).

Based on the identified wordline group, the identified threshold voltage offset bin, and the determined temperature, the memory sub-system controller may determine a set of threshold voltage offsets, which can be applied to the wordline group during the read operation to improve the bit error rate exhibited by the memory sub-system. Specifically, the memory sub-system controller may determine the set of threshold voltage offsets by two steps. The memory sub-system controller may first derive, based on the threshold voltage offset bin and the temperature, a read mask identifier from a first lookup table, where the first lookup table provides a plurality of entries, each entry provides a read mask identifier with the corresponding parameters including the threshold voltage offset bin, the temperature, or other related metric. The memory sub-system controller may then determine the set of threshold voltage offsets, based on the read mask identifier and the wordline group, the set of threshold voltage offsets from a second lookup table, where the second lookup table provides a plurality of entries, each entry provides a set of threshold voltage offsets for a wordline group with the corresponding read mask identifier.

The read mask identifier is a value serving to identify a set of threshold voltage offsets corresponding to a given wordline group, for example, a wordline group specific to a situation, e.g., high-temperature write operation to low-temperature read operation, low-temperature write operation to high-temperature read operation, SCL occurring in a short duration, high temperature data retention, latent read disturb, underfill, etc. As such, each read mask identifier references a set of the threshold voltage offsets applied to various wordline groups (e.g., in the second lookup table), and the set of memory cells for performing the read operation can be associated with one of the read mask identifiers based on the identified threshold voltage offset bin and the determined temperature (e.g., in the first lookup table). The first lookup table and the second lookup table can start with manufacturing default values, and testing can be run so that different situations (e.g., high-temperature write operation to low-temperature read operation, low-temperature write operation to high-temperature read operation, SCL occurring in a short duration, high temperature data retention, latent read disturb, underfill, etc.) for all wordline groups in the memory system can be pre-characterized.

In some implementations, the program erase cycle count associated with the set of memory cells can, in addition to the identified threshold voltage offset bin and the determined temperature, be used in determining a read mask identifier. In some implementations, the set of memory cells for performing the read operation can be associated with a read mask identifier sequence, and the read mask identifier sequence represents an order for applying, in a read error handling process, the read mask identifier, thus the set of threshold voltage offsets, The read mask identifier sequence can be determined, from the first lookup table, based on the identified threshold voltage offset bin and the determined temperature (and/or the program erase cycles). During the read error handling process, the memory sub-system controller can determine, from the second lookup table, a set of threshold voltage offsets corresponding to each read mask identifier in the order as listed in the read mask identifier sequence, and apply the set of threshold voltage offsets in sequence for read error handling.

The present disclosure provides a technology improvement to the traditional block family error avoidance that is performed on all wordlines of memory devices without adaptive adjustment and without considering the WGR-to-WGR variation, the data retention behavior difference between program erase cycles, and/or the cross-temperature difference between program and read. The present disclosure also provides a technology improvement to the existing method of determining the threshold voltage offsets, which leads to sub-optimal behavior on certain die that are outliers to begin with, and which does not consider the inconsistent relation varying from WGR to WGR.

Advantages of the present disclosure include, but are not limited to, reducing bit error rate exhibited by the memory sub-system, reducing the time required to decode the corresponding codewords, and improving overall quality of service (QOS) caused by mismatch between offsets and memory devices. Customized offsets may reduce the error rates, and free up error-recovery related resources to be used for other operations, thus reducing the latency and improving the system performance.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or another suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The memory sub-system 110 includes an offset update component 113 that can update threshold voltage offsets associated with the wordline groups of the memory device 130, 140. In some embodiments, the memory sub-system controller 115 includes at least a portion of the offset update component 113. In some embodiments, the offset update component 113 is part of the host system 110, an application, or an operating system. In other embodiments, local media controller 135 includes at least a portion of offset update component 113 and is configured to perform the functionality described herein. Further details with regards to the operations of the offset bin update component 113 are described with respect to FIGS. 2A-7.

Figure 2A:
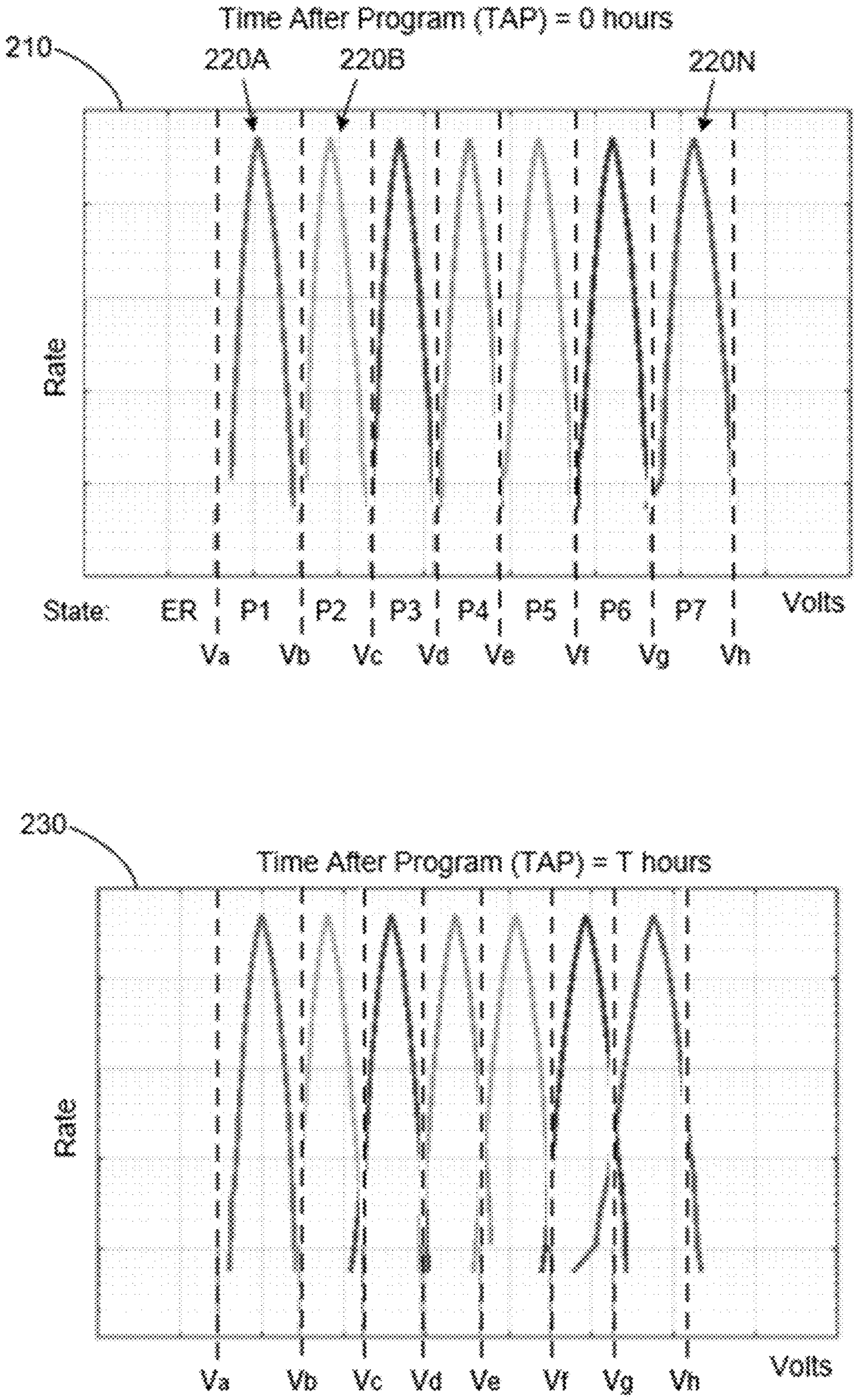
FIG. 2A schematically illustrates the temporal voltage shift caused by the slow charge loss exhibited by triple-level memory cells, in accordance with some embodiments of the present disclosure.

FIG. 2A schematically illustrates the temporal voltage shift caused by the slow charge loss exhibited by triple-level memory cells, in accordance with some embodiments of the present disclosure. While the illustrative example of FIG. 2A utilizes triple-level cells, the same observations can be made and, accordingly, the same remedial measures are applicable to single level cells and multi-level cells, as well as any other fractional or whole number of bits per cell (e.g., 3.5 bits per cell, etc.), in order to compensate for the slow charge loss.

Each of charts 210 and 230 illustrate program voltage distributions 220A-220N (also referred to as "program distributions" or "voltage distributions" or "distributions" or "levels" herein) of memory cells programmed by a respective write level (which can be assumed to be at the midpoint of the program distribution) to encode a corresponding logical level ("000" through "111" in case of a TLC). The program distributions 220A through 220N can illustrate the range of threshold voltages (e.g., normal distribution of threshold voltages) for memory cells programmed at respective write levels (e.g., program voltages). In order to distinguish between adjacent program distributions (corresponding to two different logical levels), the read threshold voltage levels (shown by dashed vertical lines) are defined, such that any measured voltage that falls below a read threshold level is associated with one program distribution of the pair of adjacent program distributions, while any measured voltage that is greater than or equal to the read threshold level is associated with another program distribution of the pair of neighboring distributions.

In chart 210, eight states of the memory cell are shown below corresponding program distributions (except for the state labeled ER, which is an erased state, for which a distribution is not shown). Each state corresponds to a logical level. The read threshold voltage levels are labeled Va-Vh. As shown, any measured voltage below Va is associated with the ER state. The states labeled P1, P2, P3, P4, P5, P6, and P7 correspond to distributions 220A-220N, respectively.

Time After Program (TAP) herein shall refer to the time since a cell has been written and is the primary driver of TVS (temporal voltage shift) along with temperature. TVS captures SCL as well as other charge loss mechanisms. TAP can be estimated (e.g., inference from a data state metric), or directly measured (e.g., from a controller clock). A cell, block, page, block family, etc. is young (or, comparatively, younger) if it has a (relatively) small TAP and is old (or, comparatively, older) if it has a (relatively) large TAP. A time slice is a duration between two TAP points during which a measurement can be made (e.g., perform reference calibration from X to Y minutes or hours after program). A time slice can be referenced by its center point.

As seen from comparing example charts 210 and 230, which reflect the time after programming (TAP) of 0 (immediately after programming) and the TAP of T hours (where T is a number of hours), respectively, the program distributions change over time due primarily to slow charge loss. In order to reduce the read bit error rate, the corresponding read threshold voltages need to be adjusted to compensate for the shift in program distributions, which are shown by dashed vertical lines. In various embodiments of the disclosure, the temporal voltage shift is selectively tracked for die groups based on measurements performed at one or more representative dice of the die group. Based on the measurements made on representative dice of a die group that characterize the temporal voltage shift and operational temperature of the dice of the die group, the threshold voltage offsets used to read the memory cells for the dice of the die group are updated and are applied to the base read threshold levels to perform read operations.

Figure 2B:
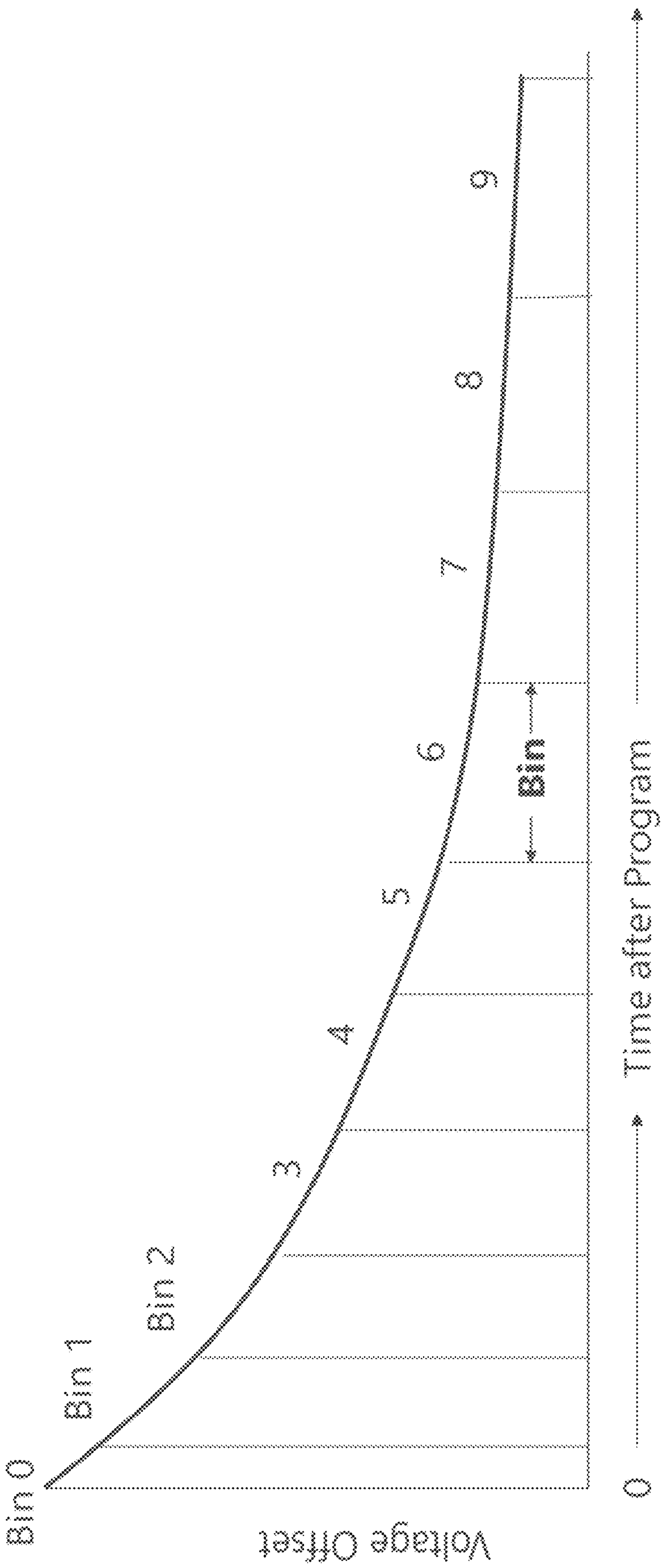
FIG. 2B schematically illustrates a set of predefined threshold voltage offset bins, in accordance with embodiments of the present disclosure.

FIG. 2B schematically illustrates a set of threshold voltage offset bins (bin-0 to bin 9), in accordance with embodiments of the present disclosure. As schematically illustrated by FIG. 2B, the threshold voltage offset graph can be subdivided into multiple threshold voltage offset bins, such that each bin corresponds to a range of threshold voltage offsets. While the illustrative example of FIG. 2B defines ten bins, in other implementations, various other numbers of bins can be employed (e.g., 64 bins).

The memory sub-system controller can associate a segment of memory device (e.g., a die group of a block family) with a threshold voltage offset bin, based on a periodically performed calibration process. The calibration process selects the set of threshold voltage offsets to be applied to the base voltage read level in order to perform read operations. The calibration process involves performing, with respect to a specified number of selected pages or blocks that is being calibrated, read operations utilizing different set of threshold voltage offsets, and choosing the set of threshold voltage offset that results in a defined error rate (e.g., a bit error rate) of the read operation. The defined error rate can be a minimum error rate, or it can be an error rate that falls within a certain range. The threshold voltage offset bin may be determined using different techniques, such as block family error avoidance (BFEA), dynamic pass-through voltage (VpassR), digital failed byte count (CFByte), or charge bucket classifier (CBC) index. That is, a segment of the memory device (e.g., cells, pages, blocks, planes, dies, etc.) can be grouped using different techniques to be associated with one or more of the threshold voltage offset bins.

In one implementation, the threshold voltage offset bin can be determined by a technique of block family error avoidance (BFEA) or similar. According to BFEA, families of blocks (or any other memory partitions) programmed within a specified time window and/or under similar environmental (e.g., temperature) conditions can be associated with one of the threshold voltage offset bins. Given that wear-leveling keeps programmed at similar program-erase cycles (PECs), the time elapsed since programming and temperature conditions are among the main factors affecting the amount of TVS, different partitions within a single block family can be presumed to exhibit similar distributions of threshold voltages of their memory cells, and thus would require the same voltage offsets to be applied to the base read levels for read operations.

Block families can be created asynchronously with respect to block programming events. "Block" herein shall refer to a set of contiguous or non-contiguous memory pages. An example of "block" is "erasable block," which is the minimal erasable unit of memory, while "page" is a minimal writable unit of memory. Each page includes of a set of memory cells. "Block family" herein shall refer to a possibly noncontiguous set of memory cells (which can reside in one or more full and/or partial blocks, the latter referred to as "partitions" herein) that have been programmed within a specified time window and a specified temperature window, and thus are expected to exhibit similar or correlated changes in their respective data state metrics in terms of temporal voltage shift. A block family may be made with any granularity, containing only whole codewords, whole pages, whole super pages, or whole superblocks, or any combination of these.

Block family creation is the process of opening a block family, maintaining that open block family for a duration, and then closing that block family. In an illustrative example, a new block family can be created ("opened") whenever a specified period of time $\Delta t$ (e.g., a predetermined number of minutes) has elapsed since creation of the last block family or whenever the reference temperature of memory cells has changed by more than a specified threshold $\Delta\Theta$ (e.g., 10 C, 20 C, or any other value). Similarly, the family can be "closed" (and a new family can be created) after the time $\Delta t$ has elapsed since the family was created or if the reference temperature has changed (in either direction) by more than $\Delta\Theta$. A memory sub-system controller can maintain an identifier of the active block family, which is associated with one or more blocks as they are being programmed.

The memory sub-system controller can periodically perform a calibration process in order to associate partitions of various families with one of the threshold voltage offset bins. Each threshold voltage offset bin, in turn, can be associated with a set of voltage offsets to be applied for read operations. Upon receiving a read command, the memory sub-system controller can (1) identify the family associated with the memory partition identified by the logical address specified in the read command, (2) identify the current threshold voltage offset bin associated with the identified family, (3) determine a set of read offsets for the identified threshold voltage offset bin, (4) compute the new read voltages by additively applying the read offsets associated with the identified threshold voltage offset bin to the base read levels, and (5) perform the read operation using the new read voltage, as described in more detail below.

The calibration process can evaluate a data state metric (e.g., a voltage shift or bit error rate) for each die of each block family with one of a set of predefined threshold voltage offset bins, e.g., by, for each die of each block family, measuring a value of data state metric of a block (of the block family) stored on the die. The calibration process can then update a bin pointer associated with the die and block family to point to a threshold voltage offset bin that corresponds to the measured value of the data state metric. Each threshold voltage offset bin is in turn associated with voltage offsets to be applied for read operations; for TLC with 8 distributions (levels) there are 7 valleys and for a given threshold voltage offset bin, which includes 7 offsets, one for each valley. For example, the bin pointer can remain the same if the data state metric is in a range associated with the existing bin pointer, or can be changed to point to an older bin if the data state metric is in a range associated with the older bin.

Generally, the temporal voltage shift for younger block families (i.e., block families that are more recently created) is more significant than the temporal voltage shift for older block families (i.e., block families that are less recently created). The memory sub-system controller can periodically perform the calibration process for each block family based on the age of the block family, which corresponds to the threshold voltage offset bin associated with the block family. For example, in an 8 threshold voltage offset bin architecture, newly created block families can be associated with threshold voltage offset bin-0, while the oldest (i.e., least recently created) block families are associated with threshold voltage offset bin 7. The memory sub-system controller performs the calibration process for the block families in threshold voltage offset bin-0 more frequently than for the block families in threshold voltage offset bin 7, based on the age of the block families associated with threshold voltage offset bin-0 (e.g., based on the logarithmic linear nature of SCL). The associations of blocks with block families and block families and dies with threshold voltage offset bins can be stored in respective metadata tables maintained by the memory sub-system controller.

FIG. 3 is an example set of read level voltage offsets as determined in accordance with some embodiments of the present disclosure. The bin-offset calibration process determines a set of read level voltage offsets that result in a sub-optimal error rate not exceeding a maximum allowable error rate, thus extending the time period during which a given block family is associated with a particular threshold voltage offset bin. FIG. 3 illustrates an example Set-N 301 of real level voltage offsets. This example set of read level voltage offsets is for a triple level cell (TLC), and thus has 7 valleys 305. Note that a set for a single-level cell (SLC) would have 1 valley, a set for a multi-level cell (MLC) would have 3 valleys, a set for a quad-level cell (QLC) would have 15 valleys, and so on. Also, in the example illustrated in FIG. 3, the set has 8 bins 303. The letters a-z represent read level voltage offsets. Note that letters a-z are an example; the read level voltage offsets can be the same in certain valleys and bins, or they can all be different. There can be more or fewer differing read level voltage offsets than illustrated in FIG. 3 (that is, the read level voltage offsets are not limited to the 26 a-z values illustrated in FIG. 3).

In this example, the memory sub-system controller has determined that read level voltage offset a, when applied to valley 1 of a TLC associated with bin-0, results in a suboptimal error rate not exceeding a maximum allowable error rate; read level voltage offset b, when applied to valley 2 of a TLC associated with bin-0, results in a suboptimal error rate not exceeding a maximum allowable error rate; read level voltage offset d, when applied to valley 3 of a TLC associated with bin-0, results in a suboptimal error rate not exceeding a maximum allowable error rate; and so on. Thus, associating a block family with Set-N 301 can extend the time period during which the block family will be in bin-0, thus reducing the frequency of the calibration process and improving overall system performance. The Set-N 301 of real level voltage offsets are updated in accordance with embodiments of the present disclosure. Further details regarding the updating process are provided with respect to FIG. 4.

Figure 4:
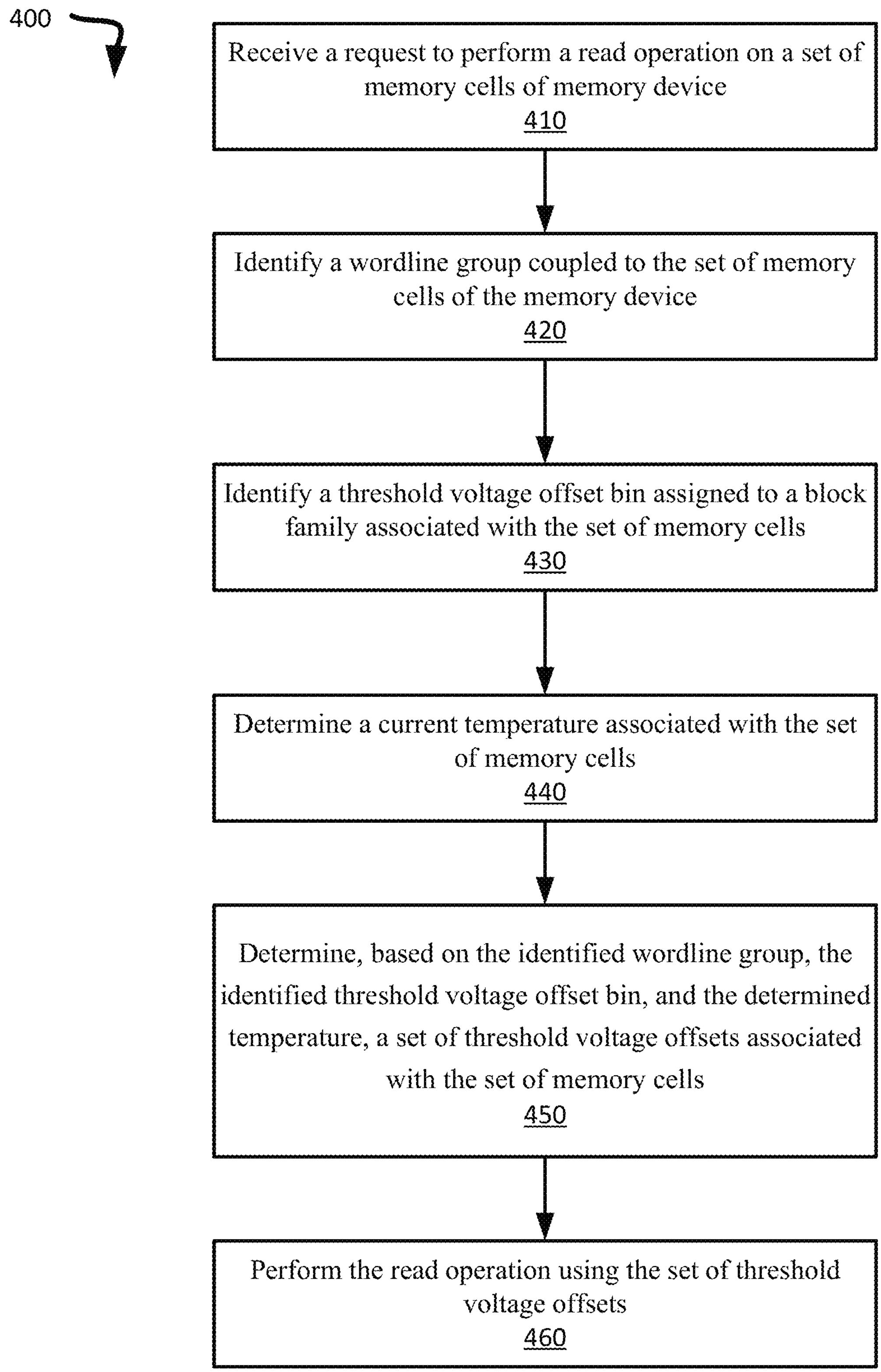
FIG. 4 is a flow diagram of an example method to update read level voltage offsets for wordline groups, in accordance with some embodiments of the present disclosure.

FIG. 4 is a flow diagram of an example method 400 to update read level voltage offsets for wordline groups, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the offset update component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic may receive a request to perform a read operation ("a read command") on the memory device. For example, the request may specify a logical address that can be used to identify a set of cells of a memory device. The set of cells of the memory device may include one or more units (e.g., a group of memory cells, a wordline group, a wordline, or individual memory cells) of a memory array of a memory device, such as memory device 130. In one embodiment, the request can be a read command received at a memory sub-system controller (e.g., the memory sub-system controller 115 of FIG. 1). The processing logic may initiate a read operation with respect to a set of target cells in response to receiving the request. In one example, the processing logic may initiate an operation to update read level voltage offsets for wordline groups with respect to a set of target cells in response to receiving a request to perform a corrective read in response to detecting a read error. The request may be initiated as an option in an error-handling flow. The read error may be detected in response to performing a host-initiated read operation or performing a calibration operation.

At operation 420, the processing logic may identify a wordline group coupled to the set of memory cells of the memory device. For example, when the read operation is to be performed on a set of cells of a memory device, the set of cells may correspond to one or more wordlines, one or more individual cells, or unconnected memory segments (e.g., not physically connected or organized, such as specific wordlines from two or more wordline groups, etc.), and the processing logic can identify one or more wordline groups from the set of cells associated with the read operation.

In some implementations, the processing logic can identify one or more wordline groups associated with the read operation through a page map. The page map maps the logical pages to a physical block. For each cell of the memory device, the page map provides the bit information and logical page information stored in the cell and the physical location information of the cell (e.g., the wordline, the sub-block, the block). Upon receiving the read command, the processing logic can use the logical address specified in the read command to identify the wordline(s) through the page map. In some implementations, the identified wordline(s) may correspond to one or more wordline groups.

At operation 430, the processing logic may identify a threshold voltage offset bin assigned to a block family associated with the set of memory cells of the memory device. In some implementations, the processing logic can identify a threshold voltage offset bin assigned to a block family through a metadata table. The metadata table provides associations of blocks with block families and block families and dies with threshold voltage offset bins. As described above, upon receiving a read command, the processing logic can identify the block family associated with the memory partition identified by the logical address specified in the read command and identify the current threshold voltage offset bin associated with the identified family through the metadata table.

In some embodiments, the processing logic may identify a segment of the memory device associated with a threshold voltage offset bin. The segment of the memory device (e.g., cells, pages, blocks, planes, dies, etc.) can be grouped using different techniques described above to be associated with one of the threshold voltage offset bins. In one implementation, the segment of the memory device may be one or more of the families of blocks (or any other memory partitions) programmed within a specified time window and/or under similar environmental (e.g., temperature) conditions (e.g., BFEA technique or like).

In one embodiment, a threshold voltage offset bin may be associated with the segment of the memory device when the processing logic determines and/or selects a set of read level voltage offsets from a plurality of sets of read level voltage offsets such that, when applied to a base read level threshold voltage associated with the segment of the memory device, result in a suboptimal error rate not exceeding a maximum allowable error rate. The sets of read level voltage offsets can be generated when the memory sub-system is manufactured, or during usage of the memory sub-system. In one embodiment, a threshold voltage offset bin may be associated with the segment of the memory device at the time of programming. In another embodiment, the processing logic may associate the block family with a threshold voltage offset bin by updating block family metadata associated with the memory device. The block family metadata can include a data structure, for example a table, which stores records, and each record in the table associates a block with the block family.

At operation 440, the processing logic may determine a characteristic temperature associated with the set of memory cells (e.g., a block) to be read as either the current temperature of the die on which the block resides or a cross-temperature of the set of memory cells (i.e., the difference between the current temperature of the die and the temperature of the die recorded at the time of performing the most recent programming operation with respect to the set of memory cells).

In some embodiments, the processing logic may determine the temperature measured as a cross temperature. The processing logic may derive a temperature measured as the cross temperature by determining the write temperature at a time when the request to perform the programming operation is received, determining the read temperature at a time when the request to perform the read operation is received, and calculating a value (Delta) of the write temperature ($T_{write}$) above the read temperature ($T_{read}$): Delta=$T_{write}-T_{read}$. The processing logic may determine the value (Delta) as the temperature measured as a cross temperature.

In some embodiments, the processing logic may determine the temperature measured as a read temperature, i.e., using the read temperature to represent a cross temperature in a case that write temperature is unavailable. The processing logic may determine the temperature by using the temperature read from a temperature sensor at the time of receiving the read command.

In one embodiment, the processing logic may obtain a temperature measurement value from a temperature sensor on the memory device 130, such as temperature sensor (i.e., an on-die temperature sensor). Depending on the embodiment, the processing logic may either query temperature sensor for a new temperature measurement in response to receiving a request (e.g., the request at operation 410), or may use a most recently measured temperature value (e.g., when temperature measurements are routinely taken at periodic intervals on memory device 130). In another embodiment, the control logic may receive a temperature measurement value from a temperature sensor external to the memory device, such as a sensor located elsewhere in memory sub-system 110.

A set of target cells may be defined to have the same temperature change. In one embodiment, memory sub-system controller 115 tracks the temperature at a certain level of granularity, such as by segment, by memory die, by memory device, etc. Accordingly, offset update component 113 can retrieve the temperature associated with the segment of the memory device including the target cells, such as from a data structure maintained in local memory 119 or elsewhere on memory device 130. For example, the processing logic may determine the read temperature at a time when the request to perform the read operation is received. Depending on the embodiment, the processing logic may determine a current temperature by either querying temperature sensor for a new temperature measurement in response to receiving a request (e.g., a read request), or using a most recently measured temperature value (e.g., when temperature measurements are routinely taken at periodic intervals on memory device 130). As such, the processing logic may determine a temperature associated with the wordline group as the temperature associated with the read command.

In some implementations, the processing logic may determine a program erase cycle (PEC) count associated with the set of cells of the memory device. In some embodiments, the processing logic may determine the PEC count for a set of target cells. A set of target cells may be defined to have the same PEC count. In one embodiment, memory sub-system controller 115 tracks the PEC count at a certain level of granularity, such as by segment, by memory die, by wordline group, by memory device, etc. Accordingly, the processing logic can retrieve the PEC count associated with the segment of the memory device including the wordline group, such as from a data structure maintained in local memory 119 or elsewhere on memory device 130.

At operation 450, based on the identified wordline group, the identified threshold voltage offset bin, and the determined temperature, the processing logic may determine a set of threshold voltage offsets associated with the set of memory cells, and the set of threshold voltage offsets can be applied to the wordline group during the read operation to improve the bit error rate exhibited by the memory sub-system.

In some implementations, the processing logic may determine the set of threshold voltage offsets by deriving, based on the threshold voltage offset bin and the temperature, a read mask identifier from a first lookup table (e.g., table 500A), where the first lookup table provides a plurality of entries, each entry provides a read mask identifier with the corresponding parameters including the threshold voltage offset bin, the temperature, or other related metric (e.g., the PEC count). The memory sub-system controller may then determine the set of threshold voltage offsets based on the read mask identifier and the wordline group, the set of threshold voltage offsets from a second lookup table (e.g., table 500B), where the second lookup table provides a plurality of entries, each entry provides a set of threshold voltage offsets for a wordline group with the corresponding read mask identifier. The read mask identifier is a value that serves to identify a set of the threshold voltage offsets corresponding to a given wordline group, for example, a wordline group specific to a situation, e.g., high-temperature write operation to low-temperature read operation, low-temperature write operation to high-temperature read operation, SCL occurring in a short duration, high temperature data retention, latent read disturb, underfill, etc. As such, each read mask identifier references a set of the threshold voltage offsets applied to various wordline groups, as shown in the second lookup table (e.g., table 500B), and the set of memory cells for performing the read operation can be associated with one of the read mask identifiers based on the identified threshold voltage offset bin and the determined temperature, as shown in the first lookup table (e.g., table 500A). The first lookup table and the second lookup table can start with manufacturing default values, and testing can be run so that different situations (e.g., high-temperature write operation to low-temperature read operation, low-temperature write operation to high-temperature read operation, SCL occurring in a short duration, high temperature data retention, latent read disturb, underfill, etc.) for all wordline groups in the memory system can be pre-characterized.

Referring to FIG. 5, an example of the first lookup table 500A includes a bin field, a temperature field, a read mask ID field, and a read mask ID sequence field. The bin field refers to a threshold voltage offset bin (represented by a bin number or a bin index). The temperature field refers to a temperature offset value based on a write temperature and a read temperature (represented by T or delta). The read mask ID refers to the read mask identifier as described above and can be represented by a number or index. The read mask ID sequence refers to a sequence of the read mask identifiers as described above and can be represent by a sequence of the numbers or index.

For example, when the bin number is smaller than or equals to B1, and the temperature is smaller than T11, the processing logic may determine the read mask ID to be X1, which can correspond to updating the threshold voltage offsets of the wordline groups for a situation of high-temperature write operation to low-temperature read operation. The processing logic may determine the read mask ID sequence to be X1, X4, X2, X3, Y1, each will be used to identify a set of the threshold voltage offsets, which will be applied to the wordline group in the order for the read error handling. In another example, when the bin number is smaller than or equals to B1, and the temperature is larger than or equals to T11 and smaller than or equals to T12, the processing logic may determine the read mask ID to be X2, which can correspond to updating the threshold voltage offsets of the wordline groups for a situation of SCL occurring in a short duration. The processing logic may determine the read mask ID sequence to be X2, X3, X4, X1, Y2, each will be used to identify a set of the threshold voltage offsets, which will be applied to the wordline group in the order for the read error handling.

In one embodiment, the processing logic may compare the bin number with a threshold value (e.g., B2) or a range of values. In one implementation, the processing logic may determine that the bin number is greater than or equal to the threshold value (e.g., B #>=B2). In another implementation, the processing logic may determine that the bin number falls in the range.

In one embodiment, the processing logic may compare the temperature with a threshold value (e.g., T21) or a range of values. In one implementation, the processing logic may determine the temperature is smaller than or equal to the threshold value (e.g., T<=T21). In another implementation, the processing logic may determine that the temperature falls in the range.

In some implementations, other performance metrics, such as program erase cycle (PEC), can be included in the table 500A (not shown) and used with the bin and the temperature to determine the read mask ID and the read mask ID sequence. For example, when the count of the program erase cycle is larger than or equals to a value, the bin number is smaller than or equals to B1, and the temperature is smaller than T11, the processing logic may determine the read mask ID to be X1. In another example, when the count of the program erase cycle is within a value range, the bin number is smaller than or equals to B1, and the temperature is larger than or equals to T11 and smaller than or equals to T12, the processing logic may determine the read mask ID to be X2.

In one embodiment, the processing logic may compare the PEC count with a threshold value or a range of values. In one implementation, the processing logic may determine the temperature is smaller than or equal to the threshold value. In another implementation, the processing logic may determine that the temperature falls in the range.

Referring to FIG. 5, an example of the second lookup table 500B includes a read mask ID field and a plurality of the wordline groups field (WGR0, WGR1, . . . . WGRn). Each wordline groups field refers to a set of threshold voltage offsets to be applied to the wordline group for the read operation, and the set of the threshold voltage offsets can be represented by a set of voltage values or a number (e.g., a bin number) that can be used to refer to the set of voltage values. For example, when the read mask ID is X1, and the wordline group is WGR0, the set of the threshold voltage offsets is O1, which can be a bin number that can be used to identify a set of voltage values, or can be an offset value that can be applied to a bin number used to identify a set of voltage values.

Referring to FIG. 6, in some implementations, the processing logic may determine the set of threshold voltage offsets by deriving, based on the threshold voltage offset bin, the temperature, the program erase cycle, and the wordline group, the set of threshold voltage offsets from a third lookup table (e.g., table 600). That is, identifying the read mask ID may be omitted, and the set of threshold voltage offsets can be identified directly. For example, when the bin number is B1, the temperature is T11, the PEC count is P1, and the wordline group is WGR0, the processing logic may determine the set of threshold voltage offsets to be 01. It is noted that each entry of variables (e.g., bin, temperature, PEC) used in determining the read mask ID in table 500A and table 600 can include one value, multiple discrete values, or a value range.

Referring back to FIG. 4, at operation 450, the processing logic may perform the read operation by applying the set of threshold voltage offsets. For example, when a read operation is requested, the processing device may identify, based on metadata associated with the memory device, the segment of the memory device associated with the logical address specified in the request. The processing device may compute a modified threshold voltage by applying the threshold voltage offset to a base read level voltage associated with the memory device. The base read level voltage can be stored in the metadata area of the memory device. The processing device may utilize the computed modified threshold voltage in order to perform the requested read operation.

Figure 7:
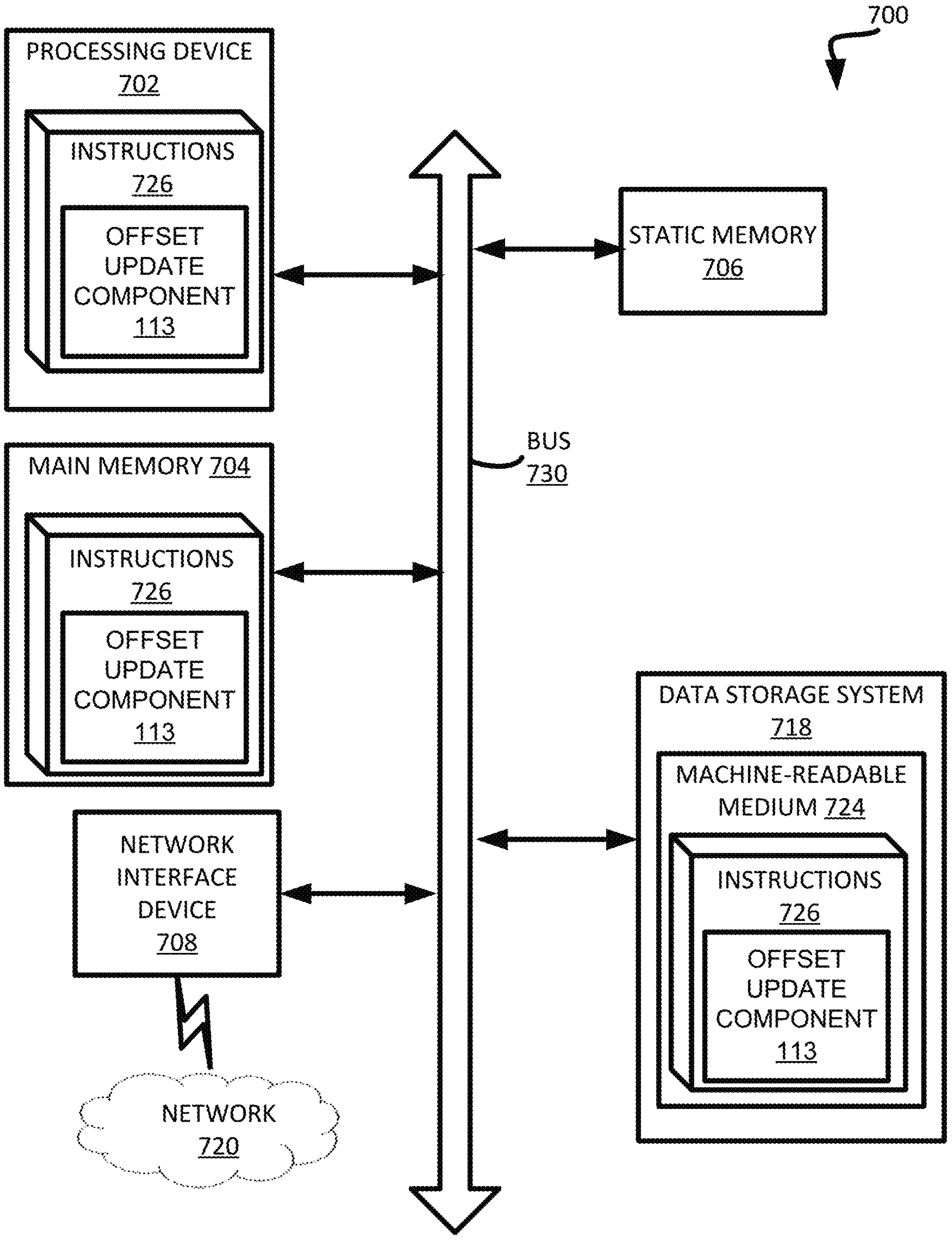
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the block family manager component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or RDRAM, etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to an offset bin update component (e.g., the offset bin update component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, which manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, which can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:

a memory device; and a processing device, operatively coupled with the memory device, to perform operations comprising:

receiving a request to perform a read operation on a set of memory cells of the memory device;

identifying, using a mapping data structure, a wordline group coupled to the set of memory cells of the memory device, wherein the wordline group is formed based on physical locations of a plurality of wordlines in the wordline group, and wherein the mapping data structure comprises a plurality of records, each record of the plurality of record mapping an identifier of a set of memory cells to a corresponding wordline group;

identifying a threshold voltage offset bin associated with the set of memory cells;

determining a current temperature associated with the set of memory cells;

determining, based on the threshold voltage offset bin and the current temperature, a read mask identifier associated with the set of memory cells;

determining, based on the read mask identifier and the wordline group, a set of threshold voltage offsets associated with the set of memory cells; and performing the read operation using the set of threshold voltage offsets.

2. The system of claim 1, wherein the read mask identifier is determined based on a first lookup table comprising a first plurality of records, wherein each record of the first plurality of record maps a threshold voltage offset bin and a current temperature to a corresponding read mask identifier, and wherein the set of threshold voltage offsets is determined based on a second lookup table comprising a second plurality of records, wherein each record of the second plurality of record maps a read mask identifier and a wordline group to a corresponding set of threshold voltage offsets.

3. The system of claim 1, wherein the current temperature is a cross temperature associated with the set of memory cells.

4. The system of claim 1, wherein determining the read mask identifier is further based on a program erase cycle count associated with the set of memory cells.

5. The system of claim 1, wherein the operations further comprise:

determining, based on the threshold voltage offset bin and the current temperature, a read mask identifier sequence associated with the set of memory cells, wherein the read mask identifier sequence is used in read error handling.

6. The system of claim 5, wherein the read mask identifier sequence is determined based on a third lookup table comprising a third plurality of records, wherein each record of the third plurality of record maps a threshold voltage offset bin and a current temperature to a corresponding read mask identifier sequence.

7. A method comprising:

receiving, by a processing device, a request to perform a read operation on a set of memory cells of a memory device;

identifying, using a mapping data structure, a wordline group coupled to the set of memory cells of the memory device, wherein the wordline group is formed based on physical locations of a plurality of wordlines in the wordline group, and wherein the mapping data structure comprises a plurality of records, each record of the plurality of record mapping an identifier of a set of memory cells to a corresponding wordline group;

identifying a threshold voltage offset bin associated with the set of memory cells;

determine a current temperature associated with the set of memory cells;

determining, based on the threshold voltage offset bin, the current temperature, and the wordline group, a set of threshold voltage offsets associated with the set of memory cells; and performing the read operation using the set of threshold voltage offsets.

8. The method of claim 7, wherein determining the set of threshold voltage offsets further comprises:

determining, based on the threshold voltage offset bin and the current temperature, a read mask identifier associated with the set of memory cells; and determining, based on the read mask identifier and the wordline group, the set of threshold voltage offsets associated with the set of memory cells.

9. The method of claim 7, wherein the set of threshold voltage offsets is determined based on a lookup table comprising a plurality of records, wherein each record of the plurality of record maps a threshold voltage offset bin, a current temperature, and a wordline group to a corresponding set of threshold voltage offsets.

10. The method of claim 7, wherein the current temperature is a cross temperature associated with the set of memory cells.

11. The method of claim 7, wherein determining the set of threshold voltage offsets is further based on a program erase cycle count associated with the set of memory cells.

12. The method of claim 7, further comprising:

determining, based on the threshold voltage offset bin and the current temperature, a read mask identifier sequence associated with the set of memory cells, wherein the read mask identifier sequence is used in read error handling.

13. The system of claim 12, wherein the read mask identifier sequence is determined based on a lookup table comprising a plurality of records, wherein each record of the plurality of record maps a threshold voltage offset bin and a current temperature to a corresponding read mask identifier sequence.

14. A non-transitory computer-readable storage medium comprising instructions that, when executed by a processing device, cause the processing device to perform operations comprising:

receiving a request to perform a read operation on a set of memory cells of a memory device;

identifying, using a mapping data structure, a wordline group coupled to the set of memory cells of the memory device, wherein the wordline group is formed based on physical locations of a plurality of wordlines in the wordline group, and wherein the mapping data structure comprises a plurality of records, each record of the plurality of record mapping an identifier of a set of memory cells to a corresponding wordline group;

identifying a threshold voltage offset bin associated with the set of memory cells;

determining a current temperature associated with the set of memory cells;

determining, based on the threshold voltage offset bin and the current temperature, a read mask identifier associated with the set of memory cells;

determining, based on the read mask identifier and the wordline group, a set of threshold voltage offsets associated with the set of memory cells; and performing the read operation using the set of threshold voltage offsets.

15. The non-transitory computer-readable storage medium of claim 14, wherein determining the read mask identifier is further based on a program erase cycle count associated with the set of memory cells.

16. The non-transitory computer-readable storage medium of claim 14, wherein the operations further comprise:

determining, based on the threshold voltage offset bin and the current temperature, a read mask identifier sequence associated with the set of memory cells, wherein the read mask identifier sequence is used in read error handling.

17. The non-transitory computer-readable storage medium of claim 14, wherein the read mask identifier is determined based on a first lookup table comprising a first plurality of records, wherein each record of the first plurality of record maps a threshold voltage offset bin and a current temperature to a corresponding read mask identifier, and wherein the set of threshold voltage offsets is determined based on a second lookup table comprising a second plurality of records, wherein each record of the second plurality of record maps a read mask identifier and a wordline group to a corresponding set of threshold voltage offsets.

* * * * *